US011138358B2

(12) United States Patent
Chawda et al.

(10) Patent No.: US 11,138,358 B2
(45) Date of Patent: Oct. 5, 2021

(54) SIMULATION AND ANALYSIS OF CIRCUIT DESIGNS

(71) Applicant: TEXAS INSTRUMENTS INCORPORATED, Dallas, TX (US)

(72) Inventors: Pradeep Kumar Chawda, Cupertino, CA (US); Shrikrishna Srinivasan, San Jose, CA (US); Mac Dien, San Jose, CA (US); Ning Dong, Plano, TX (US); Makram Monzer Mansour, San Jose, CA (US); Jeffrey Robert Perry, Cupertino, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 438 days.

(21) Appl. No.: 16/147,034

(22) Filed: Sep. 28, 2018

(65) Prior Publication Data

US 2019/0102499 A1 Apr. 4, 2019

Related U.S. Application Data

(60) Provisional application No. 62/611,920, filed on Dec. 29, 2017, provisional application No. 62/566,074, filed on Sep. 29, 2017.

(51) Int. Cl.
*G06F 30/367* (2020.01)
*G06F 30/36* (2020.01)

(52) U.S. Cl.
CPC ............ *G06F 30/367* (2020.01); *G06F 30/36* (2020.01)

(58) Field of Classification Search
CPC ............................... G06F 30/367; G06F 30/36
(Continued)

(56) References Cited

U.S. PATENT DOCUMENTS 6,334,100 B1 * 12/2001 Ahrikencheikh ..... G06F 30/367
703/14
6,356,861 B1 * 3/2002 Singhal .................. G06Q 10/06
703/2

(Continued)

OTHER PUBLICATIONS

Guofu et al. ("A method of multi-objective reliability tolerance design for electronic circuits", Chinese Journal of Aeronautics, 2013,26(1): 161-170). (Year: 2013).*

(Continued)

*Primary Examiner* — Iftekhar A Khan
(74) *Attorney, Agent, or Firm* — Ebby Abraham; Charles A. Brill; Frank D. Cimino

(57) ABSTRACT

A method includes receiving a circuit design including a plurality of components associated with a plurality of component parameters. The method further includes adjusting a value of a particular component parameter of the plurality of component parameters based on a tolerance to generate a modified plurality of component parameters. The method further includes determining, based on inputting the modified plurality of component parameters into a circuit calculator, that an operating value of the circuit design is sensitive to the particular component parameter. The method further includes selecting a simulation of the circuit design to perform based on the particular component parameter. The method further includes performing the simulation to determine whether the circuit design supports one or more design limits.

20 Claims, 8 Drawing Sheets

(58) Field of Classification Search
USPC .......................................................... 703/14
See application file for complete search history.

(56) References Cited

U.S. PATENT DOCUMENTS

| | | | | |
|---|---|---|---|---|
| 8,019,580 B1* | 9/2011 | Chandra | ................ | G06F 30/33 |
| | | | | 703/6 |
| 8,180,621 B2* | 5/2012 | Phillips | ................ | G06F 30/367 |
| | | | | 703/14 |
| 8,453,102 B1* | 5/2013 | Pack | ................ | G06F 30/327 |
| | | | | 716/139 |
| 8,533,136 B1* | 9/2013 | Xu | ................ | G06F 30/367 |
| | | | | 706/16 |
| 8,631,362 B1* | 1/2014 | Mehrotra | ............ | G06F 30/367 |
| | | | | 716/54 |
| 8,667,455 B1* | 3/2014 | Ho | ................ | G06F 30/39 |
| | | | | 716/139 |
| 9,645,715 B1* | 5/2017 | Jain | ................ | G06F 30/367 |
| 9,984,190 B1* | 5/2018 | Aurich | ................ | G06F 30/367 |
| 10,223,483 B1* | 3/2019 | Tan | ................ | G06F 30/36 |
| 10,491,167 B1* | 11/2019 | Far | ................ | H03G 3/30 |
| 2002/0193892 A1* | 12/2002 | Bertsch | ................ | G06F 30/367 |
| | | | | 700/31 |
| 2003/0006413 A1* | 1/2003 | Chawla | ................ | H01L 22/14 |
| | | | | 257/48 |
| 2003/0065486 A1* | 4/2003 | Sumida | ................ | G05B 17/02 |
| | | | | 702/189 |
| 2003/0163295 A1* | 8/2003 | Jakatdar | ................ | G06F 30/20 |
| | | | | 703/14 |
| 2004/0148579 A1* | 7/2004 | Visweswariah | ......... | G06F 30/36 |
| | | | | 716/123 |
| 2004/0153277 A1* | 8/2004 | Zhang | ................ | G06F 30/367 |
| | | | | 702/117 |
| 2004/0243374 A1* | 12/2004 | Kundert | ......... | G01R 31/318364 |
| | | | | 703/14 |
| 2005/0206394 A1* | 9/2005 | Arora | ................ | G06F 30/23 |
| | | | | 324/658 |
| 2006/0075365 A1* | 4/2006 | Hershenson | ............ | G06F 30/36 |
| | | | | 716/122 |
| 2006/0248518 A1* | 11/2006 | Kundert | ................ | G06F 30/367 |
| | | | | 717/140 |
| 2008/0072182 A1* | 3/2008 | He | ................ | G06F 30/39 |
| | | | | 716/113 |
| 2008/0195359 A1* | 8/2008 | Barker | ................ | G05B 15/02 |
| | | | | 703/2 |
| 2008/0243414 A1* | 10/2008 | Oh | ................ | G06F 30/39 |
| | | | | 702/85 |
| 2009/0144042 A1* | 6/2009 | Lorenz | ................ | G06F 30/30 |
| | | | | 703/14 |
| 2009/0228250 A1* | 9/2009 | Phillips | ................ | G06F 30/3312 |
| | | | | 703/2 |
| 2010/0017186 A1* | 1/2010 | Kim | ................ | G06F 30/367 |
| | | | | 703/14 |
| 2011/0098990 A1* | 4/2011 | Fang | ................ | G06F 30/367 |
| | | | | 703/2 |
| 2011/0146057 A1* | 6/2011 | Glazer | ................ | G06F 30/39 |
| | | | | 29/593 |
| 2011/0178789 A1* | 7/2011 | Miranda | ............ | G06F 30/367 |
| | | | | 703/16 |
| 2014/0156233 A1* | 6/2014 | Wang | ................ | G06F 30/367 |
| | | | | 703/2 |
| 2015/0019194 A1* | 1/2015 | Stella | ................ | G06F 30/367 |
| | | | | 703/14 |
| 2015/0317417 A1* | 11/2015 | Fang | ................ | G06F 30/367 |
| | | | | 703/2 |
| 2016/0239589 A1* | 8/2016 | Blackmore | ............ | G06F 30/20 |
| 2016/0283629 A1* | 9/2016 | Weckx | ................ | G06F 30/367 |
| 2016/0300004 A1* | 10/2016 | Barker | ................ | G06F 30/30 |
| 2017/0039309 A1* | 2/2017 | Wang | ................ | G06F 30/367 |
| 2017/0199953 A1* | 7/2017 | Buck | ................ | G06F 30/3312 |
| 2018/0157778 A1* | 6/2018 | Mac | ................ | G06F 30/36 |
| 2018/0314782 A1* | 11/2018 | Proulx | ................ | G06F 30/367 |
| 2019/0005184 A1* | 1/2019 | Courtin | ................ | B64F 5/60 |
| 2019/0072606 A1* | 3/2019 | Blackmore | ........ | G01R 31/2874 |
| 2020/0327207 A1* | 10/2020 | Ma | ................ | G06F 30/30 |

OTHER PUBLICATIONS

Keiter et al. ("Sensitivity Analysis in Xyce", 2016, Sandia National Laboratories, pp. 1-48). (Year: 2016).*

Ilievski 1 et al. ("Adjoint Transient Sensitivity Analysis in Circuit Simulation", 2007, ResearchGate, pp. 1-9). (Year: 2007).*

Gunyan et al. ("Nonlinear Validation of Arbitrary Load X-parameter and Measurement-Based Device Models", 2009, IEEE, pp. 1-4). (Year: 2009).*

Antreich et al. ("Circuit Analysis and Optimization Driven by Worst-Case Distances", 1992, IEEE, pp. 684-698). (Year: 1992).*

Agilent ("Transient and Convolution Simulation", 2011, Agilent Technologies, pp. 1-38). (Year: 2011).*

* cited by examiner

| # | COMPONENTS NAME | PROPERTIES | QTY | FOOTPRINT |
|---|---|---|---|---|
| | Cboot | Cap = 100.0 nF<br>VDC = 10.0 V<br>IRMS = 0.0 A | 1 | 0402  3 mm² |
| | Ccomp | Cap = 8.2 nF<br>VDC = 10.0 V<br>IRMS = 0.0 A | 1 | 0201  2 mm² |
| | Ccomp2 | Cap = 25.0 pF<br>VDC = 50.0 V<br>IRMS = 0.0 A | 1 | 0805  7 mm² |
| | Cin | Cap = 4.7 μF<br>ESR = 5.89 mOhm<br>VDC = 100.0 V<br>IRMS = 6.7739 A | 2 | 1210  15 mm² |
| | Cout | Cap = 47.0 μF<br>ESR = 3.709 mOhm<br>VDC = 100.0 V<br>IRMS = 4.2862 A | 2 | 1206_190  11 mm² |
| | D1 | VF@Io = 770.0 mV<br>VRRM = 100.0 V | 1 | DPAK  102 mm² |
| | L1 | L = 6.8 μH<br>DCR = 18.9 mOhm | 1 | XAL6060  72 mm² |
| | Rcomp | Res = 7.32 kOhm<br>Power = 63.0 Mw<br>Tolerance = 1.0% | 1 | 0402  3 mm² |
| | Rfbb | Res = 11.5 kOhm<br>Power = 63.0 Mw<br>Tolerance = 1.0% | 1 | 0402  3 mm² |
| | Rfbt | Res = 60.4 kOhm<br>Power = 63.0 Mw<br>Tolerance = 1.0% | 1 | 0402  3 mm² |
| | Rt | Res = 200.0 kOhm<br>Power = 63.0 Mw<br>Tolerance = 1.0% | 1 | 0402  3 mm² |

| OPERATING VALUES | | | | |
|---|---|---|---|---|
| # | NAME | VALUE | CATEGORY | DESCRIPTION |
| 1. | Cin IRMS | 1.106 A | Current | Input capacitor RMS ripple current |
| 2. | Cout IRMS | 427.387 mA | Current | Output capacitor RMS ripple current |
| 3. | Iin Avg | 705.82 mA | Current | Average input current |
| 4. | L Ipp | 1.48 A | Current | Peak-to-peak inductor ripple current |
| 5. | BOM Count | 13 | General | Total Design BOM count |
| 6. | FootPrint | 293.0 mm$^2$ | General | Total Foot Print Area of BOM components |
| 7. | Frequency | 488.316 kHz | General | Switching frequency |
| 8. | Mode | CCM | General | Conduction Mode |
| 9. | Pout | 25.0 W | General | Total output power |
| 10. | Total BOM | $4.57 | General | Total BOM Cost |
| 11. | ICThetaJA Effective | 26.0 degC/W | OP_Point | Effective IC Junction-to-Ambient Thermal Resistance |
| 12. | Low Freq Gain | 80.184 dB | OP_Point | Gain at 10Hz |
| 13. | Vout Actual | 5.002 V | OP_Point | Vout Actual calculated based on selected voltage divider resistors |
| 14. | Vout OP | 5.0 V | OP_Point | Operational Output Voltage |
| 15. | Cross Freq | 48.068 kHz | OP_Point | Bode plot crossover frequency |
| 16. | Duty Cycle | 13.287 % | OP_Point | Duty Cycle |
| 17. | Efficiency | 84.333 % | OP_Point | Steady state efficiency |
| 18. | Gain Marg | -16.815 dB | OP_Point | Bode Plot Gain Margin |
| 19. | IC Tj | 65.328 degC | OP_Point | IC junction temperature |
| 20. | IOUT_OP | 5.0 A | OP_Point | Iout operating point |
| 21. | Phase Marg | 67.551 deg | OP_Point | Bode Plot Phase Margin |
| 22. | VIN_OP | 42.0 V | OP_Point | Vin operating point |
| 23. | Vout p-p | 18.016 mW | Power | Peak-to-peak output ripple voltage |
| 24. | Cin Pd | 3.604 mW | Power | Input capacitor power dissipation |
| 25. | Cout Pd | 677.486 µW | Power | Output capacitor power dissipation |
| 26. | Diode Pd | 2.762 W | Power | Diode power dissipation |
| 27. | IC Pd | 1.359 W | Power | IC power dissipation |
| 28. | L Pd | 519.75 mW | Power | Inductor power dissipation |
| 29. | Total Pd | 4.644 W | Power | Total Power dissipation |
| 30. | Vout Tolerance | 2.714 % | | Vout Tolerance based on IC Tolerance (no load) and voltage divider resistors if applicable |

400

| DESIGN INPUTS | | | |
|---|---|---|---|
| # | NAME | VALUE | DESCRIPTION |
| 1. | Iout | 5.0 | Maximum Output Current |
| 2. | VinMax | 42.0 | Maximum input voltage |
| 3. | VinMin | 8.5 | Minimum input voltage |
| 4. | Vout | 5.0 | Output Voltage |
| 5. | base_pn | TPS54540 | Base Product Number |
| 6. | source | DC | Input Source Type |
| 7. | Ta | 30.0 | Ambient temperature |

FIG. 7

My Designs/Projects — Simple Navigation

Back | New | Solutions | Visualizer | BOM | Charts | Schematic | Optimize | Sim | Thermal | Build-it Lite | Export Sim | Export | Add LDO | Print | Share Design | Help English  Welcome jsmith@generic.com

Optimization Tuning

Lowest BOM Cost / Smallest Footprint ⟷ Highest Efficiency (1–5)

| Footprint | BOM Cost | Efficiency |
|---|---|---|
| 330 | $3.13 | 84 |

Change Design Inputs

Change Design #7293

| IC | TP55450 |
|---|---|
| VinMin | 14 V |
| VinMax | 22 V |
| source | DC |
| Vout | 3.3V |
| Iout | 2 A |
| tx | 30 degC |

Name: TPS5450DDAR 14.0V-22.0V
Notes:
Save Name & Notes

---

Operating Values | Sensitivity Matrix (BETA) | Worst Case Analysis (BETA)

OPERATING VALUES

Modify Operating Point — 706

Vin (V): 22.000   Iout (A): 2.000   [Recalculate]

Search

Categories:
○ Current   ○ General   ○ Op_Point   ○ Power   ● All

704 →

Export to.. ☒ Excel

| Name | Value | Category | Description |
|---|---|---|---|
| BOM Current | 0 | General | Total Design BOM count |
| Cin IRMS | 0.732A | Current | Input capacitor RMS ripple current |
| Cin Pd | 0.032A | Power | Input capacitor power dissipation |
| Cost IRMS | 167uW | Current | Output capacitor RMS ripple current |
| Cost Pd | 17.5kHz | Power | Output capacitor power dissipation |
| Df Tj | 96.5degC | Op_Point | Diode pilot crossover frequency |
| Diode Pd | 0U55W | Op_Point | D1 junction temperature |
| Duty Cycle | 16.8% | Power | Diode power dissipation |
| Efficiency | 83.72% | Op_Point | Duty Cycle |
| FootPrint | 300mm2 | Op_Point | Steady state efficiency |
| Frequency | 500kHz | General | Total Foot Print Area of BOM components |
| IC Ipk | 2.141A | General | Switching frequency |
| IC Pd | 0.24W | Current | Peak switch current in IC |
| IC Tj | 30.3degCW | Power | IC power dissipation |
| IC Tolerance | 0.01A | Op_Point | IC junction temperature |

700

| Operating Values | Sensitivity Matrix (BETA) | Worst Case Analysis (BETA) |

Worst Case Analysis calculates operating values of the design at its corner cases by varying Vin (8.5 V, 42 V), Iout (0.5 A, 5 A) and each selected co...

Run Worst Case Analysis

| Op Val | Min Val | Max Val |
|---|---|---|
| Frequency (Hz) | 100k | 881.834k |
| Efficiency (%) | 30 | 100 |
| Vout p-p (V) | 0.0 | 0.5 |
| Duty Cycle (%) | 0.0 | 100 |
| Phase Marg (deg) | 35 | 90 |
| Cross Freq (Hz) | 24.416k | 97.663k |
| Gain Marg (dB) | -31 | -10 |
| IC Ti (degC) | -40 | 150 |
| IC Ipk (A) | N/A | 6.3 |
| Cout IRMS (A) | N/A | 0.15 |
| Vout Actual (V) | 4.75 | 5.25 |

Worst Case Analysis Results

Phase Marg (deg):
  96.41 is out of range (35.00, 90.00) when vin - 8.5, iout - 5
  90.79 is out of range (35.00, 90.00) when vin - 8.5, iout - 0.5
Cross Freq (Hz):
  184.9k is out of range (24.42k, 97.66k) when vin = 42, iout = 5
  212.5k is out of range (24.42k, 97.66k) when vin = 42, iout = 0.5
Gain Marg (dB):
  -31.31 is out of range (-31.00, -10.00) when vin = -8.5, iout -5
Cout IRMS (A):
  0.2824 (should be less than 0.1500) when vin = 42, iout = 5
  0.2760 (should be less than 0.1500) when vin = -42, iout = -0.5

FIG. 8

| Component Name | Frequency (Hz) Min=100k | Efficiency (%) Min=30 | Vout p-p (V) Min=0.0 Max=0.5 | Duty Cycle (%) Min=0.0 | Phase Marg (deg) Min=35 | Cross Freq (Hz) Min=24.416k | Gain Marg (dB) Max=-10 | IC Tj (degC) Min=-40 Max=150 | IC Ipk (A) Max=6.3 |
|---|---|---|---|---|---|---|---|---|---|
| Ccomp_C (+10.0%) | | | | | 63.43 | | | | |
| Ccomp_C (-10.0%) | | | | | 63.15 | | -16.57 | | |
| Ccomp2_C (+10.0%) | | | | | 63.16 | | -16.79 | | |
| Ccomp2_C (-10.0%) | | | | | 63.45 | | -16.88 | | |
| Cout_ESR (+10.0%) | | | 10.41m | | 63.52 | | -16.48 | | |
| Cout_ESR (-10.0%) | | | 9.971m | | 63.09 | 47.51k | -16.87 | | |
| L1_I | | | 9.254m | | 62.30 | | | | 5.654 |

FIG. 9

SIMULATION AND ANALYSIS OF CIRCUIT DESIGNS

PRIORITY CLAIM

This application claims the benefit of U.S. provisional patent application No. 62/566,074, which was filed on Sep. 29, 2017 and of U.S. provisional patent application No. 62/611,920, which was filed on Dec. 29, 2017, the content of each of which is incorporated by reference.

BACKGROUND

Manual design of new electronic components may be a time consuming and potentially error-prone process. There are automated tools that enable developers to create and analyze such components. However, simulations used by such analysis tools may be associated with significant run times resulting in a lengthy development cycle for new components.

SUMMARY

In a particular example, a method includes receiving a circuit design including a plurality of components associated with a plurality of component parameters. The method further includes adjusting a value of a particular component parameter of the plurality of component parameters based on a tolerance to generate a modified plurality of component parameters. The method further includes determining, based on inputting the modified plurality of component parameters into a circuit calculator, that an operating value of the circuit design is sensitive to the particular component parameter. The method further includes selecting a simulation of the circuit design to perform based on the particular component parameter. The method further includes performing the simulation to determine whether the circuit design supports one or more design limits.

In another example, a computer readable storage device stores instructions that, when executed by one or more processors, cause the one or more processors to receive a circuit design including a plurality of components associated with a plurality of component parameters. The instructions further cause the one or more processors to adjust a value of a particular component parameter of the plurality of component parameters based on a tolerance to generate a modified plurality of component parameters. The instructions further cause the one or more processors to determine, based on inputting the modified plurality of component parameters into a circuit calculator, that an operating value of the circuit design is sensitive to the particular component parameter. The instructions further cause the one or more processors to select a simulation of the circuit design to perform based on the particular component parameter. The instructions further cause the one or more processors to perform the simulation to determine whether the circuit design supports one or more design limits.

In another example, an apparatus includes one or more processors and a memory storing instructions that, when executed by the one or more processors, cause the one or more processors to receive a circuit design including a plurality of components associated with a plurality of component parameters. The instructions further cause the one or more processors to adjust a value of a particular component parameter of the plurality of component parameters based on a tolerance to generate a modified plurality of component parameters. The instructions further cause the one or more processors to determine, based on inputting the modified plurality of component parameters into a circuit calculator, that an operating value of the circuit design is sensitive to the particular component parameter. The instructions further cause the one or more processors to select a simulation of the circuit design to perform based on the particular component parameter. The instructions further cause the one or more processors to perform the simulation to determine whether the circuit design supports one or more design limits.

BRIEF DESCRIPTION OF THE DRAWINGS

For a detailed description of various examples, reference will now be made to the accompanying drawings in which:

FIG. 3 is a diagram of a component list in accordance with an example;

FIG. 4 is a diagram illustrating nominal values of operating values in accordance with an example;

FIG. 7 is a first screen of a user interface displayed during simulation and analysis of circuit designs in accordance with an example;

FIG. 8 is a second screen of the user interface displayed during simulation and analysis of circuit designs in accordance with an example; and FIG. 9 is a third screen of the user interface displayed during simulation and analysis of circuit designs in accordance with an example.

DETAILED DESCRIPTION

Systems and methods according to the present disclosure enable performance simulation and analysis of circuit (e.g., power supply) designs. The systems and methods utilize a circuit calculator to assess a circuit design before running one or more simulations of the circuit design to assess the circuit design. A circuit calculator corresponds to an equation configured to output operating values of a circuit based on parameters associated with the circuit design (e.g., component parameters, input voltage, output current, etc.).

In particular, the systems and methods may modify (e.g., correct) the circuit design and/or identify which simulations to perform based on output of the circuit calculator. Errors identified during a simulation may result in additional simulations of alternative designs. Accordingly, correcting the circuit design before running simulations may reduce the number of simulations used to assess the circuit design because the simulations will identify fewer errors. Further, identifying specific simulations rather than executing a full set of simulations may further reduce a number of simulations run to assess the circuit design. Accordingly, the disclosed systems and methods may assess a circuit design using fewer simulations as compared to other techniques for circuit design assessment.

Figure 1:
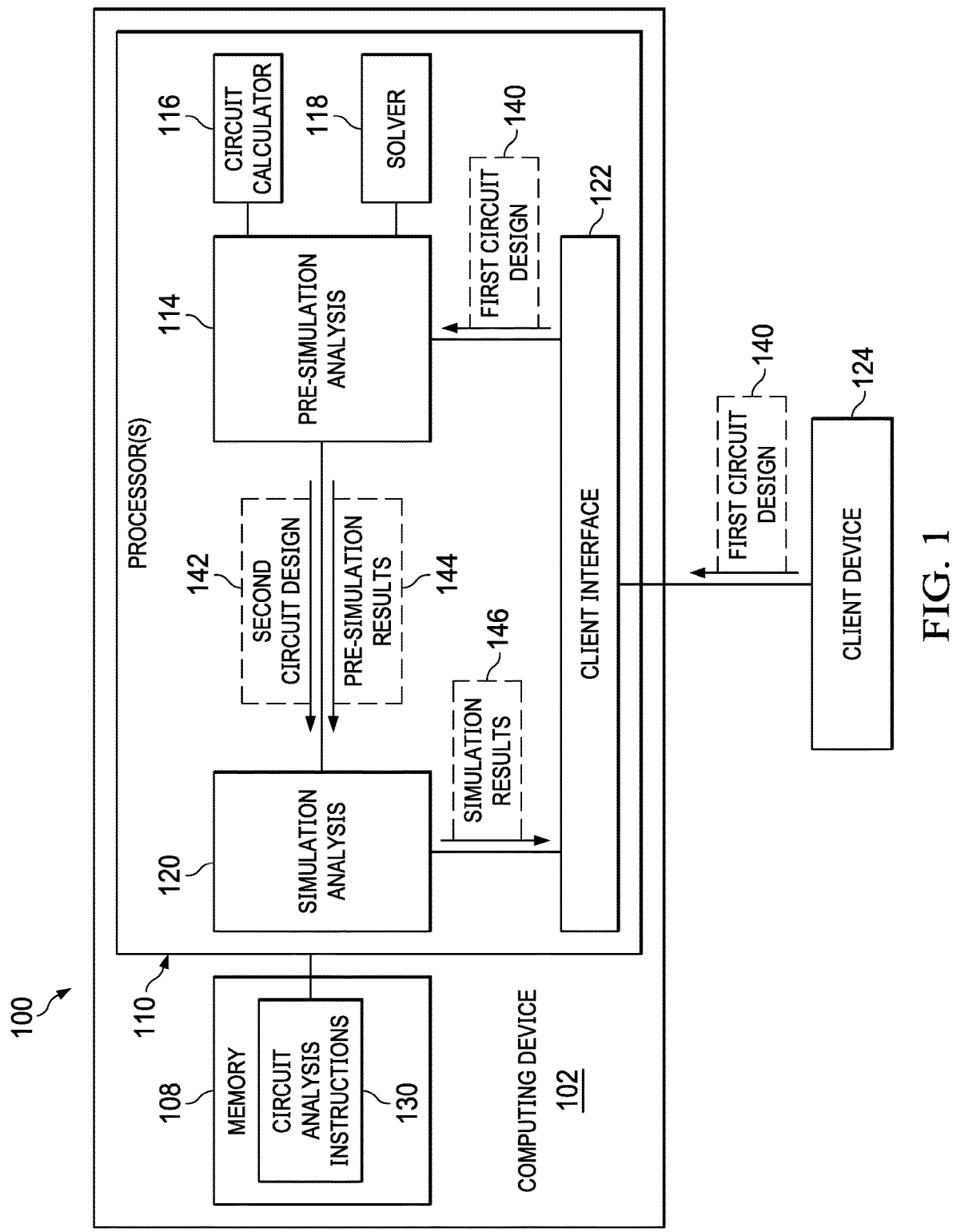
FIG. 1 illustrates a block diagram of a system for simulation and analysis of circuit designs in accordance with an example.

Referring to FIG. 1, a diagram illustrating a system 100 for analyzing a circuit design is shown. In the illustrated example, the system 100 includes a computing device 102 and a client device 124. The computing device 102 includes a memory 108 and one or more processors 110. The memory 108 is a computer readable storage device, such as a random access memory device, a hard disk drive, a solid state drive, some other memory device, or a combination thereof. As used herein, a computer readable storage device refers to an article of manufacture and is not a signal. The memory 108 stores circuit analysis instructions 130 that are executable by the processor(s) 110 to perform one or more operations described herein.

The processor(s) 110 correspond to a central processing unit ("CPU"), a digital signal processor ("DSP"), some other processing device, or a combination thereof. The processor(s) 110 include a simulation analysis module 120, a pre-simulation analysis module 114, a circuit calculator module 116, a solver module 118, and a client interface module 122. Each of the modules 114-122 may correspond to dedicated hardware circuitry or to functionality provided by the processor(s) 110 responsive to executing the circuit analysis instructions 130.

The computing device 102 and the client device 124 may correspond to any type of computing device. For example, the computing device 102 may correspond to a server device and the client device 124 may correspond to a personal computer or mobile device. The computing device 102 and the client device 124 may include additional components to those illustrated in FIG. 1. For example, the computing device 102 may include a display interface, a network interface, etc.

In the illustrated example, the client device 124 is illustrated as directly coupled to the computing device 102. In some examples, the client device 124 communicates with the computing device 102 via a wireless link. In other examples, the client device 124 communicates with the computing device 102 via one or more networks that include wired and/or wireless links. In alternate examples, the client device 124 is part of the computing device 102.

Figure 2:
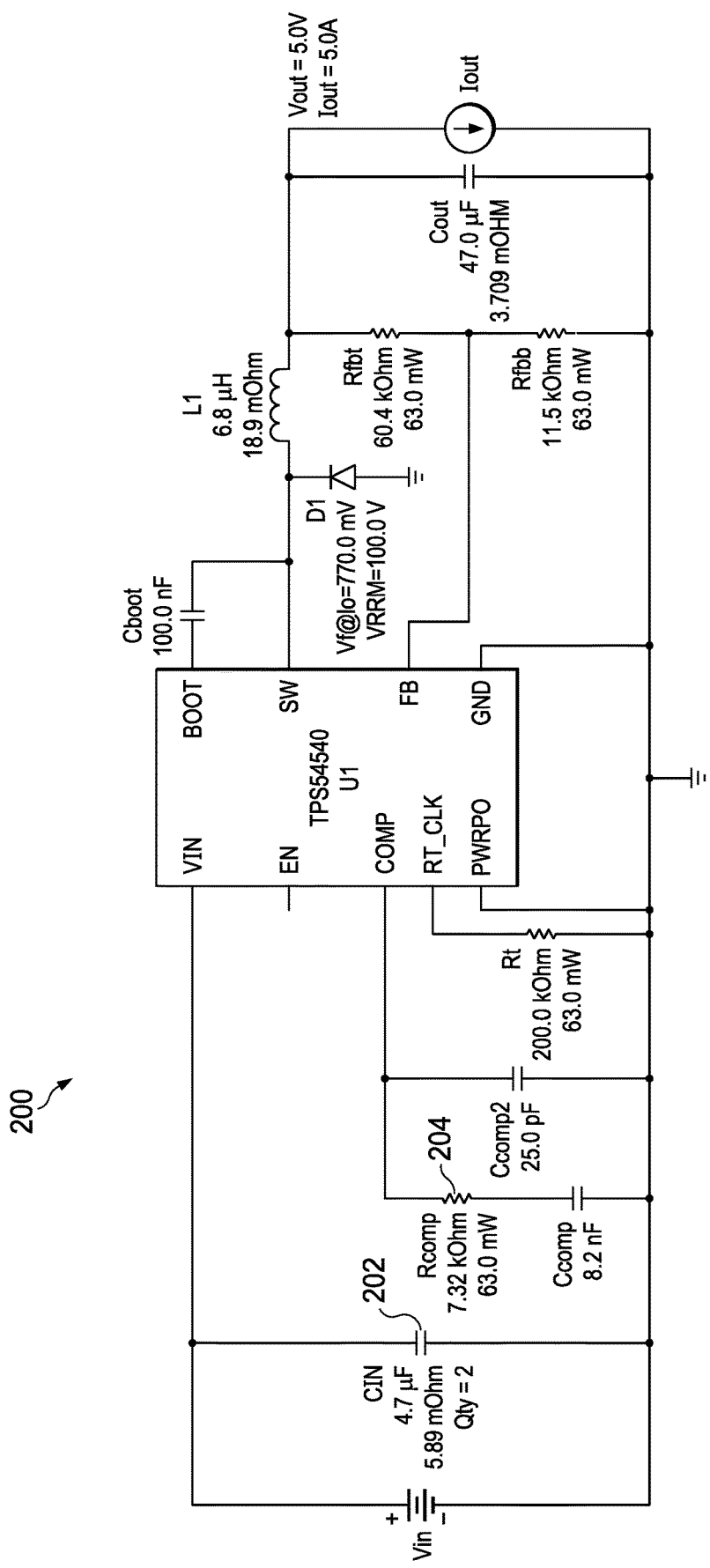
FIG. 2 is a diagram of a circuit design in accordance with an example.

In operation, the client interface module 122 generates a user interface and the computing device 102 transmits the user interface to the client device 124. A user of the client device 124 interacts with the user interface to generate and/or transmit a first circuit design 140 (or an input indicative of the first circuit design 140) to the computing device 102. The first circuit design 140 may correspond to a design of a power supply in some embodiments. The first circuit design 140 includes a plurality of components and indicates connections between the plurality of components. A diagram depicting a circuit design is shown in FIG. 2. Examples of components include a capacitor, a diode, an inductor, a resistor, a power supply (e.g., a switched-mode power supply), a transistor, etc. A diagram identifying circuit components is shown in FIG. 3.

Each component of the plurality of components may be associated with one or more component parameters (e.g., properties). As used herein, a component parameter refers to a property of a component. Examples of component parameters include capacitance ("cap" or "C"), volts direct current ("VDC"), current root-mean-square ("IRMS"), resistance ("R"), equivalent series resistance ("ESR"), forward voltage drop ("VF"), maximum repetitive reverse voltage ("VRRM"), inductance ("L"), direct current resistance ("DCR"), power, tolerance, etc. Manufacturing processes may result in, one or more component parameters of a component varying from an expected (i.e., nominal) component parameter. For example, a vendor may manufacture a component named "resistor A" that is designed to have a resistance of 1Ω. However, a manufacturing process for the resistor A may produce a first resistor A having a resistance of 0.95Ω. Similarly, a second resistor A produced by the manufacturing process may have a resistance of 0.96Ω.

The circuit design is associated with design inputs and operating value thresholds and limits. As used herein, an operating value refers to a value (or predicted value) associated with a particular aspect of a circuit during operation and that may be impacted by one or more component variations. Examples of operating values include IRMS ripple current at an input capacitor IRMS ripple current at an output capacitor, average input current, peak-to-peak inductor ripple current, total bill of materials ("BOM") count, footprint of BOM components, switching frequency, conduction mode, output power, total BOM cost, effective, integrated circuit ("IC") junction-to-ambient thermal resistance, gain at 10 hertz (Hz), actual output voltage, operational output voltage, Bode plot crossover frequency, duty cycle, steady state efficiency, Bode plot gain margin, IC junction temperature, output current ("$I_{out}$") operating point, peak-to-peak output ripple voltage, input capacitor power dissipation, output capacitor power dissipation, diode power dissipation, IC power dissipation, inductor power dissipation, total power dissipation, output voltage tolerance based on IC tolerance, etc. Operating value thresholds and limits may be generated automatically by the processor(s) 110 or may be generated by the client device 124 interacting with the client interface module 122 (e.g., responsive to user input). In a particular implementation, the operating value thresholds are received by the processor(s) 110 from the client device 124 and the operating value limits are determined by the processor(s) 110 automatically. For example, the processor(s) 110 may access a database to determine failure points of one or more components included in the design and set the operating value limits accordingly.

A design input is a value that indicates a condition under which a circuit is configured to operate. Design inputs may be independent of component variations. Examples of design inputs include maximum output current ("$I_{out}$"), maximum input voltage ("$V_{in}Max$"), minimum input voltage ("$V_{in}Min$"), output voltage ("$V_{out}$"), base product number, input source type, ambient temperature, etc. The design inputs may be generated by the client device 124 interacting with the client interface module 122 or may be automatically generated by the processor(s) 110 based on the first circuit design 140.

One or both of the operating values and the design inputs may be generated by the client device 124 interacting with the client interface module 122. Alternatively, one or both of the operating values and the design inputs may be generated automatically by the processor(s) 110 based on the first circuit design 140.

The pre-simulation analysis module 114 receives the first circuit design 140 and performs one or more analyses of the first circuit design 140 using the circuit calculator module 116. For example, the pre-simulation analysis module 114 may perform, using the circuit calculator module 116, a nominal analysis, a worst case analysis, a Monte Carlo analysis, a sensitivity analysis, or a combination thereof, as described further herein. The circuit calculator module 116 corresponds to an equation or module configured to output calculated operating values associated with a circuit design based on design inputs (e.g., input voltage, output current, etc.) and component properties. The circuit calculator module 116 may be automatically constructed by the processor(s) 110 based on the first circuit design 140.

Performing the nominal analysis may include using the circuit calculator module 116 to determine calculated operating values of the first circuit design 140 based on nominal design inputs and the nominal component parameters for the components of the first design 140. In an illustrative example, a circuit design has a nominal input voltage of 10 V, a nominal output current of 1 A, and a resistor with a nominal resistance of 5Ω. As part of a nominal analysis, the pre-simulation analysis module 114 may determine calculated operating values based on inputting (1 V, 1 A, 5Ω) to the circuit calculator module 116. In response to a calculated operating value failing to satisfy the corresponding operating value limit, the pre-simulation analysis module 114 may automatically modify the first circuit design 140, as described below. In some examples, the pre-simulation analysis module 114 causes the client interface module 122 to update the user interface displayed at the client device 124 to show results of the nominal analysis. The user interface may indicate which calculated operating values fail to satisfy the corresponding operating value limit. For example, calculated operating values that fail to satisfy the corresponding operating value limit may be displayed in red. Further, the user interface may indicate which calculated operating values fail to satisfy the corresponding operating value threshold. For example, calculated operating values that fail to satisfy the corresponding operating value threshold may be displayed in yellow. Further, the user interface may indicate which calculated operating values satisfy both the corresponding threshold and the corresponding limit. For example, calculated operating values that satisfy both the corresponding operating value threshold and the corresponding operating value limit may be displayed in green. The user interface may further include an option to replace one or more components of the first circuit design 140. An example of a user interface screen displaying results of a nominal analysis is shown and described with reference to FIG. 7.

Performing the worst case analysis may include using the circuit calculator module 116 to determine calculated operating values of the first circuit design 140 by varying each design input and each component parameter by a corresponding tolerance. The tolerance of each design input and each component parameter may be input by a user (e.g., via the client interface module 122) or determined automatically by the processor(s) 110. In an illustrative example, a circuit design has a nominal input voltage of 10 V with a tolerance of 10%, a nominal output current of 1 A with a tolerance of 10%, and a resistor with a nominal resistance of 5Ω and a tolerance of 10%. The pre-simulation analysis module 114 may determine calculated operating values based on inputting (0.9 V, 1 A, 5Ω), (0.9 V, 1 A, 4.5Ω), (0.9 V, 1 A, 5.5Ω) (0.9, V, 0.9 A, 5Ω), (0.9 V, 0.9 A, 4.5Ω), (0.9 V, 0.9 A, 5.5Ω) (0.9 V, 1.1 A, 5Ω), (0.9 V, 1.1 A, 4.5Ω), (0.9 V, 1.1 A, 5.5Ω), (1 V, 0.9 A, 5Ω), (1 V, 0.9 A, 4.5Ω), (1 V, 0.9 A, 5.5Ω), (1 V, 1 A, 4.5Ω), and (1 V, 1 A, 5.5Ω) to the circuit calculator module 116. In response to a calculated operating value failing to satisfy the corresponding operating value limit, the pre-simulation analysis module 114 may automatically modify the first circuit design 140, as described below. In some examples, the pre-simulation analysis module 114 causes the client interface module 122 to update the user interface displayed at the client device 124 to show results of the worst case analysis. As explained above, a calculated operating value that satisfies both the corresponding limit and threshold may be displayed in green, an operating value that satisfies the limit but not the threshold may be displayed in yellow, and a calculated operating value that fails to satisfy both the limit and the threshold may be displayed in red. An example of a user interface screen displaying results of a worst case analysis is shown and described with reference to FIG. 8.

Performing the Monte Carlo analysis may include using the circuit calculator module 116 to determine calculated operating values of the first circuit design 140 based on randomly selected values for each design input and each component parameter within the corresponding tolerance. The Monte Carlo analysis may include generating calculated operating values based on random values a plurality of times. In response to a calculated operating value failing to satisfy the corresponding operating value limit, the pre-simulation analysis module 114 may automatically modify the first circuit design 140, as described below. In some examples, the pre-simulation analysis module 114 causes the client interface module 122 to update the user interface displayed at the client device 124 to show results of the Monte Carlo analysis. As explained above, a calculated operating value that satisfies both the corresponding limit and threshold may be displayed in green, an operating value that satisfies the limit but not the threshold may be displayed in yellow, and a calculated operating value that fails to satisfy both the limit and the threshold may be displayed in red.

Performing the sensitivity analysis may include using the circuit calculator module 116 to determine calculated operating values of the first circuit design 140 by varying each component parameter by the corresponding tolerance. In particular examples, the pre-simulation analysis module 114 varies a single component parameter per operating value calculation. The tolerance of each design input and each component parameter may be input by a user (e.g., via the client interface module 122) or determined automatically by the processor(s) 110. Accordingly, the pre-simulation analysis module 114 may identify which component parameters affect which operating values. In an illustrative example, a circuit design has a nominal input voltage of 10 V, a nominal output current of 1 A, a resistor with a nominal resistance of 5Ω and a tolerance of 10%, and a capacitor with a nominal capacitance of 2 F and a tolerance of 10%. The pre-simulation analysis module 114 may determine calculated operating values based on inputting (1 V, 1 A, 4.5Ω, 2 F), (0.9 V, 1 A, 5.5Ω, 2 F), (1 V, 1 A, 5Ω, 1.8 F), and (1 V, 1 A, 5Ω, 2.2 F) to the circuit calculator module 116.

In response to a calculated operating value failing to satisfy the corresponding operating value limit, the pre-simulation analysis module 114 may automatically modify the first circuit design 140, as described below. In response to a calculated operating value satisfying the corresponding limit but failing to satisfy the corresponding threshold, the pre-simulation analysis module 114 may determine that the operating value is sensitive to the component parameter that was varied to generate the calculated operating value. For example, if the circuit calculator module 116 outputs a calculated phase margin value that does not satisfy the phase margin threshold in response to (1 V, 1 A, 4.5Ω, 2 F) (i.e., input where resistance varies from the nominal resistance), the circuit calculator may determine that the phase margin operating value is sensitive to the resistance value. In some examples, the pre-simulation analysis module 114 causes the client interface module 122 to update the user interface displayed at the client device 124 to show results of the sensitivity analysis. As explained above, a calculated operating value that satisfies both the corresponding limit and threshold may be displayed in green, an operating value that satisfies the limit but not the threshold may be displayed in yellow, and a calculated operating value that fails to satisfy both the limit and the threshold may be displayed in red. In some examples, calculated operating values that satisfy both the corresponding limit and the corresponding threshold may not be displayed. An example of a user interface screen displaying results of a worst case analysis is shown and described with reference to FIG. 9.

The pre-simulation analysis module 114 may modify the first circuit design 140 based on one or more of the pre-simulation analyses using the solver module 118. The solver module 118 may correspond to a non-linear solver. In particular, the solver module 118 may be configured to minimize an objective function defined as ObjFun=$\Sigma_{i=0}^{n} w_i x_i^2$, where $x_i$ is a difference between a limit of operating value$_i$ and the value of operating value$_i$ indicated by the circuit calculator module 116 and $w_i$ is a weight. For example, if i corresponds to an output capacitor RMS ripple current, $x_i$ corresponds to a difference between a limit of the output capacitor RMS ripple current operating value and a calculated value of the output capacitor RMS ripple current operating value. Accordingly, if the limit of the RMS ripple current indicates that the output capacitor RMS ripple current is to be between 424 mA and 425 mA, and the circuit calculator module 116 determines that the value of the output capacitor RMS ripple current is 426 mA, $x_i$ may be 1.

In some embodiments, the pre-simulation analysis module 114 may modify the first circuit design 140 based on one pre-simulation analysis before performing a subsequent pre-simulation analysis. To illustrate, the pre-simulation analysis module 114 may perform a worst case analysis of the first circuit design 140 as modified by the solver module 118 in response to a nominal analysis.

The pre-simulation analysis module 114 generates a second circuit design 142 based on the modifications to the first circuit design 140 identified by the solver module 118. In examples in which no modifications are made to the first circuit design 140 by the pre-simulation analysis module 114, the second circuit design 142 corresponds to the first circuit design 140.

The pre-simulation analysis module 114 further generates pre-simulation results 144 based on the pre-simulation analyses. The pre-simulation results 144 may include results of a nominal analysis, a sensitivity analysis, a worst case analysis, a Monte Carlo analysis, or a combination thereof. In particular examples, the pre-simulation results 144 identify one or more key parameters. A key parameter may be a parameter (e.g., component parameter, design input, etc.) to which an operating value of the second circuit design 142 is sensitive. In other examples, key parameters may also be identified by the worst case analysis and/or the Monte Carlo analysis. For example, parameters that result in a calculated operating value failing to satisfy the corresponding threshold during the worst case analysis or the Monte Carlo analysis may be key parameters.

The pre-simulation results 144 may further identify which operating values are sensitive to each key parameter. The simulation analysis module 120 may perform one or more simulations based on the pre-simulation results 144. For example, the simulation analysis module 120 may select one or more types of simulation to perform based on sensitive operating values identified in the pre-simulation results 144. To illustrate, the simulation analysis module 120 may perform a transient analysis type simulation in response to voltage output ripple being identified as a sensitive operating value. Further, the simulation analysis module 120 may vary only the key parameters when performing the simulations. Because the simulation analysis module 120 identifies which types of simulations to perform and which parameters to vary in the simulations based on the pre-simulation results 144, the simulation analysis module 120 may perform relatively few simulations. In some implementations, the simulation analysis module 120 initiates performance of the selected simulations at one or more other devices. For example, the simulation analysis module 120 may initiate parallel performance of the identified simulations by a cloud-based computing architecture.

Based on results of the simulations, the simulation analysis module 120 generates simulation results 146 identifying a simulated value for each of the sensitive operating values identified by the pre-simulation results 144. For example, the simulation analysis module 120 may identify the voltage output ripple as 0.11 V. Further, the simulation analysis module 120 may compare each simulated value to the corresponding operating value threshold and the corresponding operating value limit.

The simulation results 146 may identify whether each of the simulated values satisfies the corresponding operating value threshold and the corresponding operating value limit (e.g., whether the second circuit design 142 supports design limits associated with the first circuit design 140). For example, the voltage output ripple operating value may be associated with a limit range of between 0 and 0.33 V and a threshold range of between 0 and 0.1 V. Accordingly, if the simulated voltage output ripple is identified as 0.11 V, the simulation analysis module 120 may determine that the simulated voltage output ripple satisfies the limit but not the threshold associated with voltage output ripple. In particular examples, the simulation analysis module 120 may indicate whether a simulated operating value satisfies the corresponding limit and/or threshold by associating an output color with the simulated operating value. To illustrate, green may indicate that a simulated operating value satisfies both the corresponding threshold and the corresponding limit, yellow may indicate that the simulated operating value satisfies the corresponding limit but not the threshold, and red may indicate that the simulated operating value satisfies neither the corresponding limit nor the threshold.

The client interface module 122 updates the graphical user interface displayed to the client device 124 based on the simulation results 146. For example, the client interface module 122 may update the graphical user interface to display the simulated operating values and whether each simulated operating values satisfies the corresponding limit and threshold (e.g., based on the associated output color). Thus, a user of the client device 124 may readily see whether the second circuit design 142 satisfies the limits and/or the thresholds set for the first circuit design 140.

Therefore, the system of FIG. 1 may analyze a circuit design. In particular, the system of FIG. 1 may perform a pre-simulation analysis to correct the circuit design and identify particular simulations to perform during simulation analysis of the circuit design. Accordingly, the system of FIG. 1 may enable more accurate analysis of a circuit design while relying on fewer simulations. Therefore, the system of FIG. 1 may analyze a circuit design more quickly than other analysis tools.

Referring to FIG. 2, a diagram illustrating a circuit design 200 is shown. The circuit design 200 includes a plurality of components, such as a "Cin" capacitor 202 and an "Rcomp" resistor 204. The circuit design 200 shown in FIG. 2 may correspond to the first circuit design 140 or to the second circuit design 142. FIG. 3 is a diagram depicting a list 300 of the plurality of components of the circuit design 200. The list 300 identifies component parameters 304 for each component 302. To illustrate, the Cin capacitor 202 has a capacitance 4.7 µF, an ESR of 5.89 mOhm, a VDC of 100.0 V, and an IRMS of 6.7739 A and the Rcomp resistor 204 has a resistance of 7.32 kOhms, a power of 63.0 mW, and a tolerance of 1.0%.

Figures 5, 6:
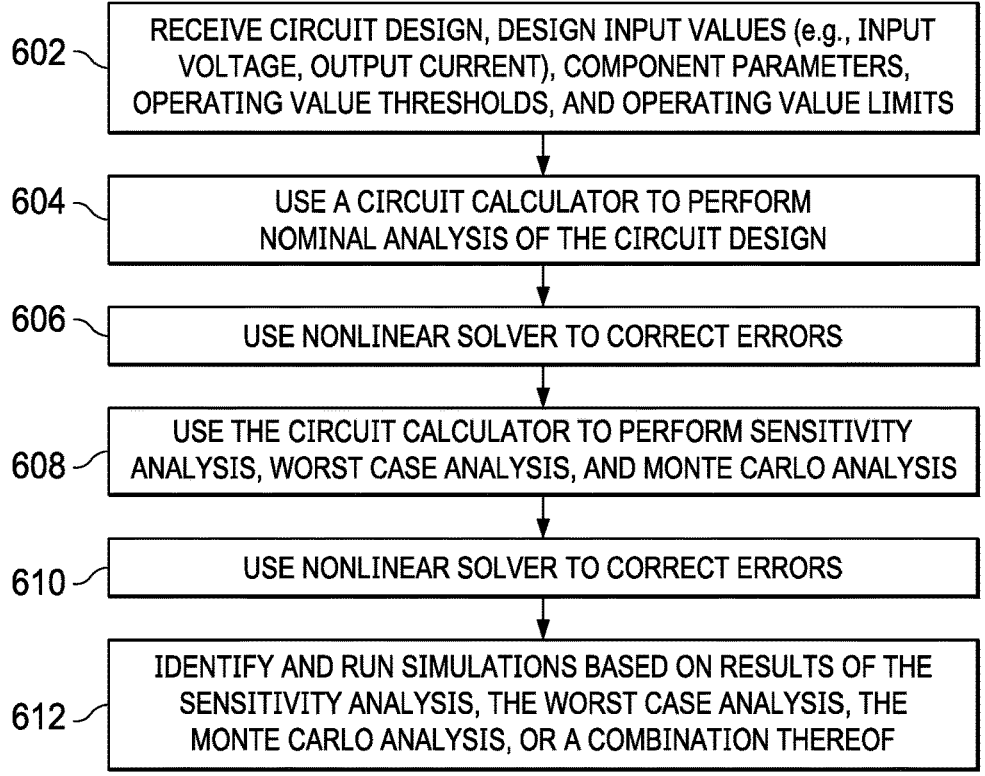
FIG. 5 is a diagram illustrating design inputs in accordance with an example.
FIG. 6 is a flowchart illustrating a method for simulation and analysis of circuit designs.

FIG. 4 illustrates simulated operating values 400 of the circuit design 200. The simulated operating values 400 may correspond to the simulation results 146 of FIG. 1. FIG. 5 is an illustrative example of design inputs 500 associated with the circuit design 200.

Referring to FIG. 6, a flowchart illustrating a method 600 of analyzing a circuit design is shown. The method 600 may be performed by a computing device, such as the computing device 102 of FIG. 1. The method 600 includes receiving a circuit design, design input values, component parameters, operating value thresholds, and operating value limits, at 602. For example, the computing device 102 may receive the first circuit design 140 and corresponding design input values (e.g., nominal design input values), component parameters (e.g., nominal component parameter values), operating value thresholds, and operating value limits.

The method 600 further includes using a circuit calculator to perform a nominal analysis of the circuit design, at 604. For example, the pre-simulation analysis module 114 may perform a nominal analysis of the first circuit design 140 using the circuit calculator module 116, as explained above. The method 600 further includes using a nonlinear solver to correct errors identified in the nominal analysis, at 606. For example, the pre-simulation analysis module 114 may use the solver module 118 to automatically replace components in the first circuit design 140 in response to calculated operating values generated during the nominal analysis failing to satisfy the corresponding operating value limits.

The method 600 further includes using the circuit calculator to perform a sensitivity analysis, a worst case analysis, and a Monte Carlo analysis, at 608. For example, the pre-simulation analysis module 114 may perform a sensitivity analysis, a worst case analysis, and a Monte Carlo analysis on the first circuit design 140 (e.g., as corrected following the nominal analysis), as explained above.

The method 600 further includes using a nonlinear solver to correct errors, at 610. For example, the pre-simulation analysis module 114 may use the solver module 118 to automatically replace components in the first circuit design 140 in response to calculated operating values generated during the sensitivity analysis, the worst case analysis, or the Monte Carlo analysis failing to satisfy the corresponding operating value limits.

The method 600 further includes identifying and running simulations based on results of the sensitivity analysis, the worst case analysis, the Monte Carlo analysis, or a combination thereof. For example, the simulation analysis module 120 may perform simulations identified based on the pre-simulation results 144 (e.g., key parameters) identified based on the sensitivity analysis, the worst case analysis, the Monte Carlo analysis, or a combination thereof.

Thus, FIG. 6 illustrates a method in which a number of simulations used to analyze a circuit design is reduced by first analyzing the circuit design using a circuit calculator. This method may be faster or more efficient as compared to other methods of circuit design analysis.

Referring to FIG. 7, a first screen 700 of a user interface is shown. The first screen 700 may be generated by the client interface module 122 and displayed at the client device 124. The first screen 700 identifies a list of nominal calculated operating values 704. The list of nominal calculated operating values 704 may be generated by the pre-simulation analysis module 114 based on a nominal analysis of a circuit. In the illustrated example, the first screen includes an element 706 configured to receive design inputs (e.g., input voltage and output current). The nominal calculated operating values 704 may be calculated based on the design inputs input into the element 706.

Referring to FIG. 8, a second screen 800 of a user interface is shown. The second screen 800 may be generated by the client interface module 122 and displayed at the client device 124. The second screen 800 displays results of a worst case analysis. The second screen 800 identifies limits 804 for operating values. In the illustrated example, the limits 804 correspond to limit ranges. The second screen 800 further indicates parameters 806 identified by the pre-simulation analysis module 114 as causing an operating value to fail to satisfy the corresponding operating value limit during the worst case analysis. To illustrate, a phase margin operating value 810 has a corresponding limit of 35-90 degrees. The second screen 800 indicates that the phase margin operating value 810 does not satisfy the corresponding limit when input voltage is equal to 8.5 V and output current is equal to 5.

Referring to FIG. 9, a third screen 900 of a user interface is shown. The third screen 900 may be generated by the client interface module 122 and displayed at the client device 124. The third screen 900 displays results 902 of a sensitivity analysis. In the illustrated example, the results 902 indicate which component parameter variations 904 result in an operating value exceeding a corresponding operating value threshold. For example, FIG. 9 shows that varying a capacitance of a "Ccomp" capacitor by 10% results in a phase margin operating value failing to satisfy the phase margin operating value threshold. The third screen 900 further includes a first interface element 906 configured to receive an input voltage value to be used in the sensitivity analysis. The third screen 900 further includes a second interface element 908 configured to receive an output current value to be used in the sensitivity analysis. The third screen 900 further includes a third interface component 910 configured to receive a component parameter tolerance value. The component parameter tolerance value is used to vary the component parameters during the sensitivity analysis. In the illustrated example, the component variation is set to 10%. Accordingly, the pre-simulation analysis module 114 will vary component parameters by ±10% during the sensitivity analysis. The third screen 900 further includes a fourth interface element configured to receive an operating values threshold. The operating values threshold is used to calculate an operating value threshold for each operating value. In the illustrated example, the operating values threshold is set to 0.1%. Accordingly, the pre-simulation analysis module 114 will set each operating value threshold to ±0.1% of the nominal operating value.

Thus, FIGS. 7-9 illustrate screens of a graphical user interface that may be displayed during analysis and design of a circuit design. In particular, the screens illustrated may correspond to pre-simulation analyses that may reduce a number of simulations used to analyze a circuit design.

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple"

or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A method comprising:
   receiving a circuit design including a plurality of components associated with a plurality of component parameters;
   adjusting a value of a first particular component parameter of the plurality of component parameters based on a tolerance to generate a first modified plurality of component parameters;
   determining, based on inputting the first modified plurality of component parameters into a circuit calculator, that a first operating value of the circuit design is sensitive to the first particular component parameter;
   modifying a value of a second particular component parameter of the plurality of component parameters in response to the determining and in response to an objective function calculated using an operating value and an operating value limit, to generate a second modified plurality of component parameters;
   determining, based on inputting the second modified plurality of component parameters into the circuit calculator, that a second operating value of the circuit design is sensitive to the second particular component parameter;
   selecting a first simulation of the circuit design to perform based on the first operating value and select a second simulation of the circuit design to perform based on the second operating value; and
   performing the first and second simulations to determine whether the circuit design supports one or more design limits.

2. The method of claim 1, wherein the circuit calculator corresponds to an equation configured to generate a plurality of operating values associated with the circuit design based on a set of component parameters of the plurality of components included in the circuit design.

3. The method of claim 1, wherein the simulation includes a transient simulation, an alternating current simulation, a parametric simulation, or a combination thereof.

4. The method of claim 1, wherein the plurality of component parameters include a capacitance, a resistance, an inductance, a forward voltage drop, or a combination thereof.

5. The method of claim 1, wherein the plurality of components include a capacitor, a diode, an inductor, a resistor, or a combination thereof.

6. The method of claim 1, wherein the operating value corresponds to a root mean square of ripple current, a power dissipation, a crossover frequency, a temperature, a feedback tolerance, a thermal resistance, voltage drop, or a ripple voltage.

7. The method of claim 1, wherein the modifying the value of the second particular component parameter is performed in response to modifying values of the component parameters to optimize a value of the objective function.

8. The method of claim 7, wherein the objective function is calculated in response to a difference between the operating value and the operating value limit.

9. The method of claim 1, further comprising outputting a graphical user interface displaying an evaluation of the circuit design based on the simulation.

10. A computer readable storage device storing instructions that, when executed by one or more processors, cause the one or more processors to:
    receive a circuit design including a plurality of components associated with a plurality of component parameters;
    adjust a value of a first particular component parameter of the plurality of component parameters based on a tolerance to generate a first modified plurality of component parameters;
    determine, based on inputting the first modified plurality of component parameters into a circuit calculator, that a first operating value of the circuit design is sensitive to the first particular component parameter;
    modify a value of a second particular component parameter of the plurality of component parameters in response to the determining and in response to an objective function calculated using an operating value and an operating value limit to generate a second modified plurality of component parameters;
    determine, based on inputting the second modified plurality of component parameters into the circuit calculator, that a second operating value of the circuit design is sensitive to the second particular component parameter;
    select a first simulation of the circuit design to perform based on the first operating value and select a second simulation of the circuit design to perform based on the second operating value; and
    perform the first and second simulations to determine whether the circuit design supports one or more design limits.

11. The computer readable storage device of claim 10, wherein the circuit calculator corresponds to an equation configured to generate a plurality of operating values associated with the circuit design based on a set of component parameters of the plurality of components included in the circuit design.

12. The computer readable storage device of claim 10, wherein the simulation includes a transient simulation, an alternating current simulation, a parametric simulation, or a combination thereof.

13. The computer readable storage device of claim 10, wherein the plurality of component parameters include a capacitance, a resistance, an inductance, a forward voltage drop, or a combination thereof.

14. The computer readable storage device of claim 10, wherein the plurality of components include a capacitor, a diode, an inductor, a resistor, or a combination thereof.

15. The computer readable storage device of claim 10, wherein the operating value corresponds to a root mean square of ripple current, a power dissipation, a crossover frequency, a temperature, a feedback tolerance, a thermal resistance, voltage drop, or a ripple voltage.

16. The computer readable storage device of claim 10, wherein the modifying the value of the second particular component parameter is performed in response to modifying values of the component parameters to optimize a value of the objective function.

17. The computer readable storage device of claim 16, wherein the objective function is calculated in response to a difference between the operating value and the operating value limit.

18. The computer readable storage device of claim 10, further comprising outputting a graphical user interface displaying an evaluation of the circuit design based on the simulation.

19. An apparatus comprising:
one or more processors; and
a memory storing instructions that, when executed by the one or more processors, cause the one or more processors to:
receive a circuit design including a plurality of components associated with a plurality of component parameters;
adjust a value of a first particular component parameter of the plurality of component parameters based on a tolerance to generate a first modified plurality of component parameters;
determine, based on inputting the first modified plurality of component parameters into a circuit calculator, that a first operating value of the circuit design is sensitive to the first particular component parameter;
modify a value of a second particular component parameter of the plurality of component parameters in response to the determining and in response to an objective function calculated using an operating value and an operating value limit, to generate a second modified plurality of component parameters;
determine, based on inputting the second modified plurality of component parameters into the circuit calculator, that a second operating value of the circuit design is sensitive to the second particular component parameter;
select a first simulation of the circuit design to perform based on the first operating value and select a second simulation of the circuit design to perform based on the second operating value; and
perform the first and second simulations to determine whether the circuit design supports one or more design limits.

20. The apparatus of claim 19, wherein the circuit calculator corresponds to an equation configured to generate a plurality of operating values associated with the circuit design based on a set of component parameters of the plurality of components included in the circuit design.

\* \* \* \* \*